United States Patent
Suga et al.

(12)

(10) Patent No.: US 6,356,128 B2
(45) Date of Patent: Mar. 12, 2002

(54) METHOD AND CIRCUITRY FOR SUPPLYING CLOCK TO INTERNAL CIRCUIT

(75) Inventors: Kenichi Suga; Katsunobu Hongo, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/768,238

(22) Filed: Jan. 25, 2001

(30) Foreign Application Priority Data

May 1, 2000 (JP) ............................................ 12-132750

(51) Int. Cl.[7] .............................................. H03L 7/00
(52) U.S. Cl. ........................................ 327/160; 327/116
(58) Field of Search ................................ 327/114, 116, 327/119, 120–122, 142, 147–151, 156–160; 377/47, 48

(56) References Cited

U.S. PATENT DOCUMENTS 5,982,208 A * 11/1999 Kokubo et al. ............. 327/119
6,177,821 B1    1/2001 Morikawa
6,225,840 B1 *  5/2001 Ishimi ........................ 327/116
6,255,882 B1 *  7/2001 Hirai .......................... 327/291

* cited by examiner

Primary Examiner—My-Trang Nu Ton
(74) Attorney, Agent, or Firm—Burns, Doane, Swecker & Mathis, LLP

(57) ABSTRACT

Clock supply circuitry comprises a phase-locked loop or PLL frequency multiplier for generating a frequency-multiplied clock signal having a frequency that is an integral multiple of the frequency of an input clock signal. The clock supply circuitry further includes a PLL output stability detecting circuit. When the clocksupply circuitry is made to return from a clock supply stopping state in which the PLL frequency multiplier is stopping the generation of the frequency-multiplied clock signal to a clock supply state in which the PLL frequency multiplier is generating and supplying the frequency-multiplied clock signal to an internal circuit, the PLL output stability detecting circuit determines whether the frequency-multiplied clock signal from the PLL frequency multiplier becomes stable. After the PLL output stability detecting circuit determines that the frequency-multiplied clock signal becomes stable, it supplies the frequency-multiplied clock signal from the PLL frequency multiplier as a system clock signal to the internal circuit.

6 Claims, 9 Drawing Sheets

METHOD AND CIRCUITRY FOR SUPPLYING CLOCK TO INTERNAL CIRCUIT

BACKGROUND OF THE INVENTION

1. Field of the Invention

The present invention relates to a method and circuitry for supplying a system clock signal to an integrated circuit (or internal circuit) of a semiconductor device, such as a microcomputer, including a built-in phase-locked loop (i.e., PLL) frequency multiplier.

2. Description of the Prior Art

Referring now to FIG. 9, there is illustrated a schematic circuit diagram showing the structure of prior art clock supply circuitry including a PLL frequency multiplier, the clock supply circuitry being built in a semiconductor device. In the figure, reference numeral 10 denotes the semiconductor device including the prior art clock supply circuitry, numeral 20 denotes the PLL frequency multiplier for generating a frequency-multiplied clock signal from an input clock signal, the frequency-multiplied clock signal having a frequency that is an integral multiple of the frequency of the input clock signal, numeral 30 denotes an oscillator driving circuit for driving an external oscillator connected between an input terminal Xin and an output terminal Xout, numeral 40 denotes a PLL output supply circuit for delivering the frequency-multiplied clock signal from the PLL frequency multiplier 20 as a system clock signal to an integrated circuit 50 after counting a pulse of the input clock signal applied to the PLL frequency multiplier 20 a predetermined number of times, when returning the clock supply circuitry from a stop state in which it is stopping the supply of the system clock to the integrated circuit 50 to its original state or clock supply state in which it is supplying the system clock signal to the integrated circuit 50, numeral 401 denotes a counter for reloading a maximum count value thereinto and resetting its output so as. to put its output at a "Low" level every time a control signal or stop instruction signal applied thereto becomes a "High" level, and for starting counting down pulses of the input clock signal applied to the PLL frequency multiplier 20 and for furnishing an output at a "High" level when it underflows, numeral 402 denotes an SR flip-flop having an S terminal connected to an output terminal of the counter 401 and an R terminal for receiving the stop instruction signal, numeral 403 denotes a switch having a control terminal connected to a Q terminal of the SR flip-flop 402, numeral 60 denotes an SR flip-flop having an S terminal for receiving a recovery instruction signal and an R terminal for receiving the stop instruction signal, and numeral 70 denotes a switch having a control terminal connected to a Q terminal of the SR flip-flop 60. The system clock signal that is the output (or PLL output) of the PLL frequency multiplier 20 can be applied, by way of the switch 403, to the integrated circuit 50.

In operation, the counter 401 reloads the maximum count value thereinto and resets its output so as to put its output at a "Low" level every time the stop instruction signal applied to a control terminal thereof becomes a "High" level. When the Q output of the SR flip-flop 402 becomes a "High" level, the switch 403 is brought into conduction or placed to the ON position. In contrast, when the Q output of the SR flip-flop 402 becomes a "Low" level, the switch 403 is brought out of conduction or placed to the OFF position. Similarly, when the Q output of the SR flip-flop 60 becomes a "High" level, the switch 70 is brought into conduction or placed to the ON position. In contrast, when the Q output of the SR flip-flop 60 becomes a "Low" level, the switch 70 is brought out of conduction or placed to the OFF position. A signal passing through each of the two switches 403 and 70 has either a "High" level or a "Low" level according to whether a corresponding input signal has a voltage greater than or equal to or less than a threshold value.

A clock generating device 11 as shown in FIG. 10 can be connected to the input terminal Xin of FIG. 9. As an alternative, an external oscillator 12 as shown in FIG. 11 can be connected between the input terminal Xin and the output terminal Xout.

First, a description will be made as to the operation of the clock supply circuitry when a clock generating device 11 is connected to the input terminal Xin, as shown in FIG. 10. While the clock supply circuitry is placed in a clock supply stopping state, i.e., stop state in which it is stopping the supply of the system clock signal to the integrated circuit 50, both the PLL frequency multiplier 20 and the oscillator driving circuit 30 are at a stand still. When the clock supply circuitry is brought to the stop state, the stop instruction signal becomes a "High" level and the recovery instruction signal becomes a "Low" level. As a result, the SR flip-flop 60 is reset and its Q output becomes a "Low" level, and therefore the switch 70 is brought out of condition. When the stop instruction signal becomes a "High" level, the counter 401 reloads the maximum count value thereinto and resets its output so as to put its output at a "Low" level, and then starts counting down pulses of the input clock signal applied to the PLL frequency multiplier 20. In this case, since no clock pulse is applied to the counter 401, the counter 401 keeps its count value at the maximum count value. Furthermore, the SR flip-flop 402 is also reset and its Q output becomes a "Low" level, and therefore the switch 403 is brought out of condition. As a result, the output terminal of the PLL frequency multiplier 20 is disconnected from the integrated circuit 50.

When the recovery instruction signal becomes a "High" level while the clock supply circuitry is placed in the stop state, the semiconductor device 10 starts a recovery process of canceling the stopping of the supply of the system clock signal to the integrated circuit. First, the PLL frequency multiplier 20 and the oscillator driving circuit 30 start working. Since the stop instruction signal simultaneously becomes a "Low" level, the SR flip-flop 60 is set and its Q output becomes a "High" level, and therefore the switch 70 is brought into condition. Although the PLL frequency multiplier 20 receives a stable clock signal from the clock generating device 11, as shown in FIG. 12, the PLL output supply circuit 40 cannot supply the PLL output to the integrated circuit 50 immediately after it receives the frequency-multiplied clock signal because some interval of time is required for the frequency-multiplied clock signal (or PLL output) from the PLL frequency multiplier 20 to become stable. In order to keep the switch 403 being in the OFF position until the PLL output becomes stable, the counter 401 of the PLL output supply circuit 40 counts down pulses of the input clock signal from the maximum count value. When the counter 401 underflows, it furnishes an output at a "High" level. As a result, the SR flip-flop 402 is set and the switch 403 is brought into conduction or placed to the ON position, and therefore the frequency-multiplied clock signal from the PLL frequency multiplier 20 is supplied as the system clock signal to the integrated circuit 50. The recovery process is thus completed. The length of time that elapses until the counter 401 underflows after the recovery process is started and the input clock signal is then applied to the counter 401 corresponds to the maximum count value set to the counter 401. The maximum count value is predetermined based on the simulated or measured longest time required for the PLL output to become stable so that the maximum count value allows for a margin. The longest time can be determined by estimating the time required for the output of the PLL frequency multiplier to become stable, and either performing circuit simulations in consideration of variations in ambient temperature and power supply voltage or performing experiments under a variety of operating conditions. As shown in FIG. 12, the PLL output supply circuit 40 brings the switch 403 into conduction at the expiration of about the margin after the PLL output becomes stable.

Next, a description will be made as to the operation of the clock supply circuitry when an external oscillator 12 is connected between the input terminal Xin and the output terminal Xout, as shown in FIG. 11. As in the case that the clock generating device 11 is connected to the input terminal Xin, as shown in FIG. 10, the PLL output supply circuit 40 measures the time that elapses before the frequency-multiplied clock signal from the PLL frequency multiplier 20 becomes stable using the counter 401 without supplying the PLL output to the integrated circuit 50 immediately after receiving the frequency-multiplied clock signal because some interval of time is required for the frequency-multiplied clock signal to become stable. When the counter 401 counts down pulses of the input clock signal from the maximum count value and then underflows, it furnishes an output at a "High" level to set the SR flip-flop 402 and hence bring the switch 403 into conduction. As a result, the frequency-multiplied clock signal from the PLL frequency multiplier 20 is supplied as the system clock signal to the integrated circuit 50. The recovery process is thus completed.

Unlike the case where the clock generating device 11 is connected to the input terminal Xin, as previously explained, the oscillation of the external oscillator 12 and hence the waveform of the input clock signal are unstable immediately after the recovery process is started, as shown in FIG. 13. Nevertheless, the input clock signal (or PLL input) having an unstable waveform is furnished to the PLL frequency multiplier 20. Therefore, in order to make the frequency-multiplied clock signal that is the output of the PLL frequency multiplier 20 become stable, the oscillation of the external oscillator 12 needs to become stable first. In other words, the input clock signal applied to the input terminal Xin needs to become stable first.

In this case, the maximum count value set to the counter 401 is predetermined based on the simulated or measured longest time required for the PLL output to become stable so that the maximum count value allows for a margin. The longest time can be determined by estimating the time required for the external oscillator 12 to become stable and the time required for the output of the PLL frequency multiplier 20 to become stable, and either performing circuit simulations in consideration of variations in ambient temperature and power supply voltage or performing experiments under a variety of operating conditions. As shown in FIG. 13, the PLL output supply circuit 40 brings the switch 403 into conduction at the expiration of about the margin after the input clock signal becomes stable and, after that, the PLL output becomes stable.

A problem with prior art clock supply circuitry constructed as above is that the maximum count value set to the counter 401 has to be predetermined so that the maximum count value allows for a margin, by estimating the time required for the output of the PLL frequency multiplier to become stable, further estimating the time required for the external oscillator to become stable when needed, and evaluating the longest time required for the PLL output to become stable by simulation or experiment in consideration of variations in ambient temperature and power supply voltage, and therefore additional time and effort must be expended on the determination of the maximum count value.

Another problem is that since no mechanism for determining whether the output of the PLL frequency multiplier becomes stable is provided, the maximum count value set to the counter corresponds to a length of time longer than necessary and therefore it takes much time for the system clock to be delivered to the internal circuit, such as an integrated circuit, after the recovery process is started, so that the semiconductor device cannot perform processes at expected times, and, even though the PLL frequency multiplier does not become stable, the PLL frequency multiplier can furnish its output to the internal circuit and hence the internal circuit may run away.

SUMMARY OF THE INVENTION

The present invention is proposed to solve the above problems. It is therefore an object of the present invention to provide a clock supply method and circuitry capable of supplying a system clock signal to an internal circuit as soon as possible after a recovery process of canceling the stopping of the supply of the system clock signal to the internal circuit is started so as to make the internal circuit work, thus preventing the internal circuit from running away.

In accordance with one aspect of the present invention, there is provided a method of supplying a system clock signal to an internal circuit, comprising the steps of: when returning to a clock supply state in which a phase-locked loop or PLL frequency multiplier is generating a frequency-multiplied clock signal from an input clock signal and supplying the frequency-multiplied clock signal to the internal circuit, the frequency-multiplied clock signal having a frequency that is an integral multiple of the frequency of the input clock signal, from a clock supply stopping state in which the PLL frequency multiplier is stopping the generation of the frequency-multiplied clock signal, determining whether the frequency-multiplied clock signal from the PLL frequency multiplier becomes stable; and supplying the frequency-multiplied clock signal as the system clock signal to the internal circuit after it is determined that the frequency-multiplied clock signal becomes stable.

Preferably, the determining step is the step of determining whether signals generated by the PLL frequency multiplier for controlling the frequency of the frequency-multiplied clock signal indicate that the frequency of the frequency-multiplied clock signal becomes stable, and, when the signals indicate that the frequency of the frequency-multiplied clock signal becomes stable, the frequency-multiplied clock signal is supplied as the system clock signal to the internal circuit.

In accordance with another aspect of the present invention, there is provided clock supply circuitry for supplying a system clock signal to an internal circuit, the circuitry comprising: a phase-locked loop or PLL frequency multiplier for generating a frequency-multiplied clock signal having a frequency that is an integral multiple of the frequency of an input clock signal; and a PLL output stability detecting circuit for determining whether the frequency-multiplied clock signal from the PLL frequency multiplier becomes stable when the clock supply circuitry is made to return from a clock supply stopping state in which the PLL frequency multiplier is stopping the generation of the frequency-multiplied clock signal to a clock supply state in which the PLL frequency multiplier is generating and supplying the frequency-multiplied clock signal to the internal circuit, and for supplying the frequency-multiplied clock signal from the PLL frequency multiplier as the system clock signal to the internal circuit after the PLL output stability detecting circuit determines that the frequency-multiplied clock signal becomes stable.

Preferably, the PLL output stability detecting circuit includes a switch disposed between an output terminal of the PLL frequency multiplier and the internal circuit, the switch being placed to ON position when the PLL output stability detecting circuit supplies the frequency-multiplied clock signal as the system clock signal to the internal circuit, and a control unit for placing the switch to the ON position when signals generated by the PLL frequency multiplier for controlling the frequency of the frequency-multiplied clock signal indicate that the frequency of the frequency-multiplied clock signal becomes stable when returning the clock supply circuitry from the clock supply stopping state to the clock supply state.

The PLL frequency multiplier can include a phase comparator for comparing a phase of the input clock signal with that of a frequency-divided clock signal, and for furnishing an XINFAST signal including a pulse having a duration corresponding to a phase difference between the phases of the input clock signal and the frequency-divided clock signal and a PLLFAST signal fixed at a certain level opposite to the level of the pulse of the XINFAST signal when the phase of the input clock signal leads that of the frequency-divided clock signal, for furnishing a PLLFAST signal including a pulse having a duration corresponding to a phase difference between the phases of the input clock signal and the frequency-divided clock signal and an XINFAST signal fixed at a certain level opposite to the level of the pulse of the PLLFAST signal when the phase of the input clock signal lags behind that of the frequency-divided clock signal, and for furnishing XINFAST and PLLFAST signals fixed at the certain level when the input clock signal is in phase with the frequency-divided clock signal. The PLL frequency multiplier can further include a charge pump for furnishing a pulse at a "High" level having a duration corresponding to the pulse of the XINFAST signal when the phase of the input clock signal leads that of the frequency-divided clock signal, and for furnishing a pulse at a "Low" level having a duration corresponding to the pulse of the PLLFAST signal when the phase of the input clock signal lags behind that of the frequency-divided clock signal, a low-pass filter for converting the pulse from the charge pump into a DC voltage, a voltage-controlled oscillator for generating and furnishing the frequency-multiplied clock signal having a frequency corresponding to the DC voltage, and a frequency divider for dividing the frequency of the frequency-multiplied clock signal so as to generate the frequency-divided clock signal having a frequency that is an integral submultiple of that of the frequency-multiplied clock signal.

Preferably, the control unit includes a logical circuit for receiving the XINFAST and PLLFAST signals from the PLL frequency multiplier and for generating a control signal asserted when the XINFAST and PLLFAST signals are at different or opposite levels; a counter, responsive to the control signal from the logical circuit, for reloading a maximum count value thereinto, resetting its output to a "Low" level, and starting counting down the input clock signal from the maximum count value, and for furnishing a signal at a "High" level when it underflows, and an SR flip-flop having an S terminal for receiving an output of the counter, an R terminal for receiving a stop instruction signal that becomes a "High" level when the clock supply circuitry stops the supply of the system clock signal to the internal circuit, and a Q terminal via which the SR flip-flop furnishes a switching signal for switching the switch between ON and OFF positions.

Further objects and advantages of the present invention will be apparent from the following description of the preferred embodiments of the invention as illustrated in the accompanying drawings.

DETAILED DESCRIPTION OF THE PREFERRED EMBODIMENTS

Figure 1:
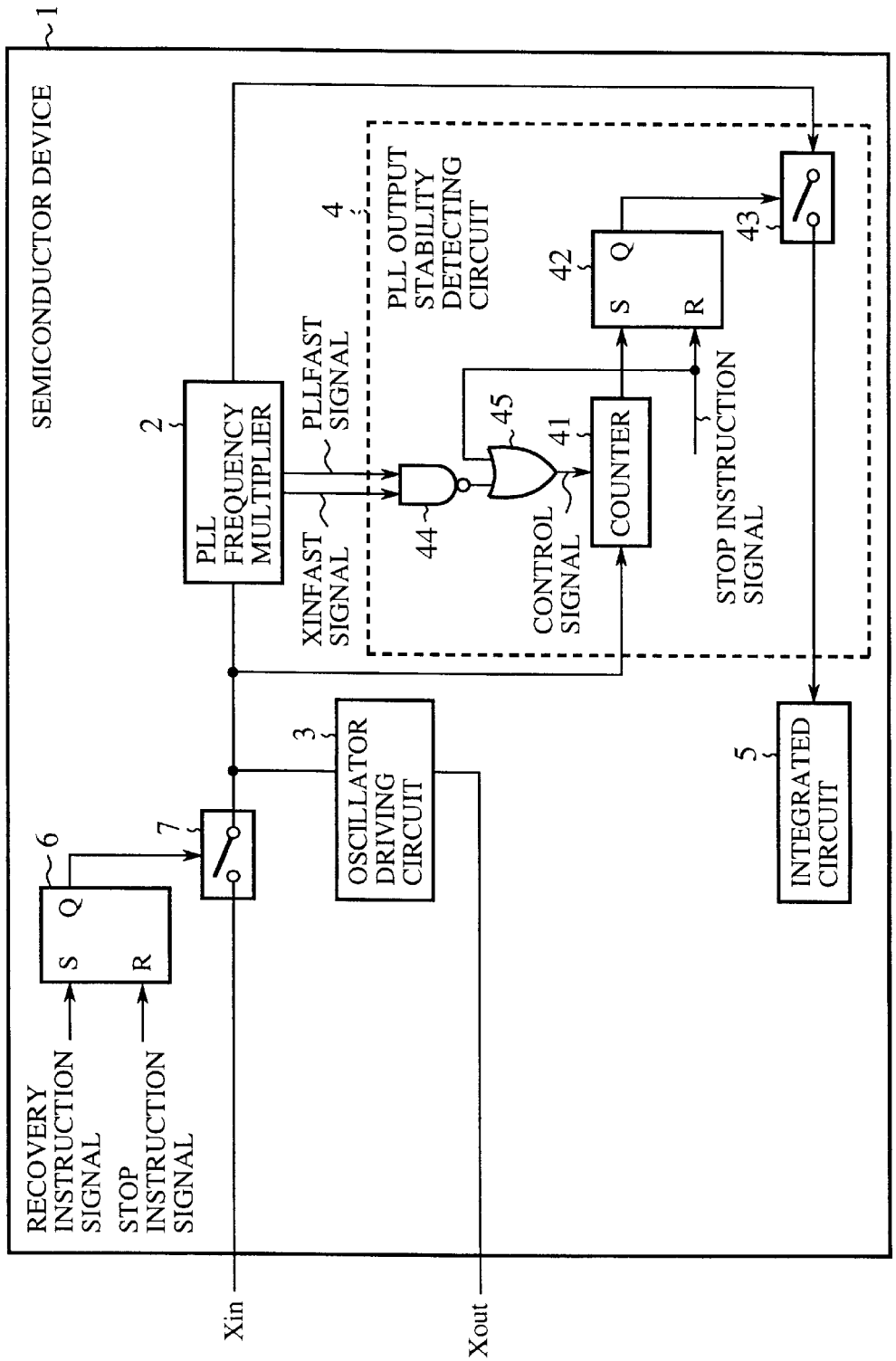
FIG. 1 is a schematic circuit diagram showing the structure of clock supply circuitry according to an embodiment of the present invention.

Referring next to FIG. 1, there is illustrated a block diagram showing the structure of clock supply circuitry according to an embodiment of the present invention, the clock supply circuitry including a built-in PLL frequency multiplier. In the figure, reference numeral 1 denotes a semiconductor device in which the clock supply circuitry according to the embodiment of the present invention is built, numeral 2 denotes the PLL frequency multiplier built in the semiconductor device 1, for generating a frequency-multiplied clock signal from an input clock signal applied thereto via an input terminal Xin, the frequency-multiplied clock signal having a frequency that is an integral multiple of the frequency of the input clock signal, numeral 3 denotes an oscillator driving circuit for driving an external oscillator connected between the input terminal Xin and an output terminal Xout, numeral 4 denotes a PLL output stability detecting circuit for determining whether the output of the PLL frequency multiplier 2 becomes stable when returning the clock supply circuitry from a clock supply stopping state or stop state in which the PLL frequency multiplier 2 is stopping the supply of the frequency-multiplied clock signal to an integrated circuit (or internal circuit) 5 to its original state or clock supply state in which the PLL frequency multiplier 2 is supplying the frequency-multiplied. clock signal to the integrated circuit, and for supplying the frequency-multiplied clock signal as a system clock signal to the integrated circuit 5 immediately after the PLL output stability detecting circuit 4 determines that the frequency-multiplied clock signal becomes stable.

Reference numeral 41 denotes a counter for reloading a maximum count value thereinto and resetting its output every time a control signal applied thereto becomes a "High" level, for starting counting down pulses of the input clock signal applied to the PLL frequency multiplier 2, and for furnishing an output at a "High" level when it underflows, numeral 42 denotes an SR flip-flop having an S terminal connected to an output terminal of the counter 41 and an R terminal for receiving a stop instruction signal, numeral 43 denotes a switch having a control terminal connected to a Q terminal of the SR flip-flop 42, numeral 44 denotes a NAND gate for implementing the logical NAND operation on an XINSTART signal and a PLLFAST signal output from the PLL frequency multiplier 2 and for furnishing the logical NAND operation result, numeral 45 denotes an OR gate for implementing the logical OR operation on the output of the NAND gate 44 and the stop instruction signal and for furnishing the logical OR operation result as the control signal to the counter 41, numeral 6 denotes an SR flip-flop having an S terminal for receiving a recovery instruction signal and an R terminal for receiving the stop instruction signal, and numeral 7 denotes a switch having a control terminal connected to a Q terminal of the SR flip-flop 6. The system clock signal that is the output (or PLL output) of the PLL frequency multiplier 2 can be applied, by way of the switch 43, to the integrated circuit 5. The maximum count value set to the counter 41 is greater than or equal to 2 in hex.

Figure 2:
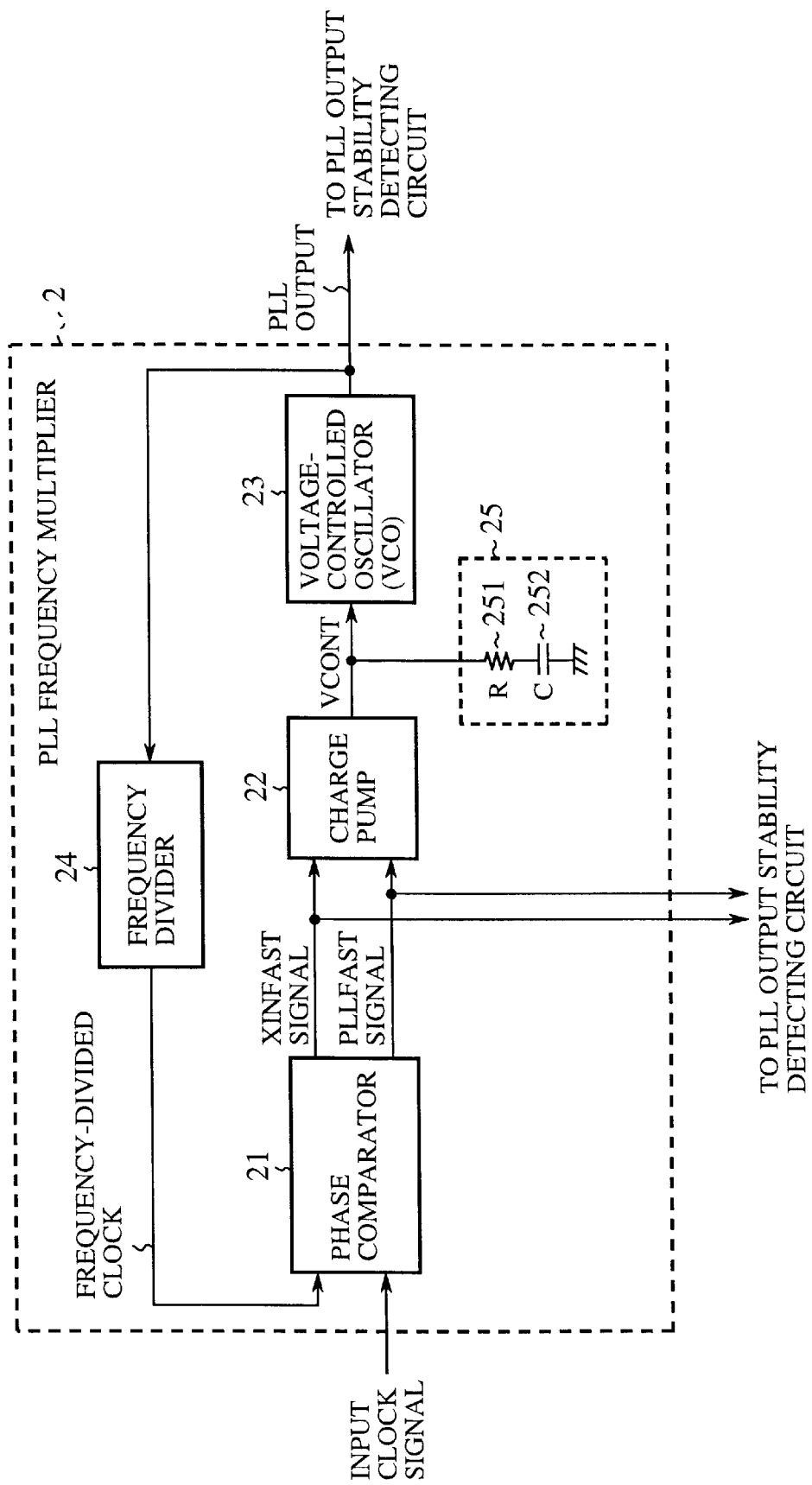
FIG. 2 is a schematic circuit diagram showing the structure of a PLL frequency multiplier included in the clock supply circuitry, as shown in FIG. 1, according to the embodiment of the present invention.

Referring next to FIG. 2, there is illustrated a schematic circuit diagram showing the structure of the PLL frequency multiplier 2 included in the clock supply circuitry according to the embodiment of the present invention. In the figure, reference numeral 21 denotes a phase comparator for comparing the phase of the input clock signal applied thereto via the switch 7 with that of a frequency-divided clock signal from a frequency divider 24, and for controlling the XINFAST and PLLFAST signals to be furnished to the PLL output stability detecting circuit 4 so that the input clock signal is in phase with the frequency-divided clock signal, numeral 22 denotes a charge pump, numeral 23 denotes a voltage-controlled oscillator or VCO for generating the frequency-multiplied clock signal having a frequency corresponding to a DC voltage VCONT applied thereto, and numeral 25 denotes a low-pass filter that consists of a resistor 251 and a capacitor 252. The frequency divider 24 divides the frequency of the frequency-multiplied clock signal output from the VCO 23 with a predetermined frequency dividing ratio to generate the frequency-divided clock signal having a frequency that is an integral submultiple of that of the frequency-multiplied clock signal.

Figure 3:
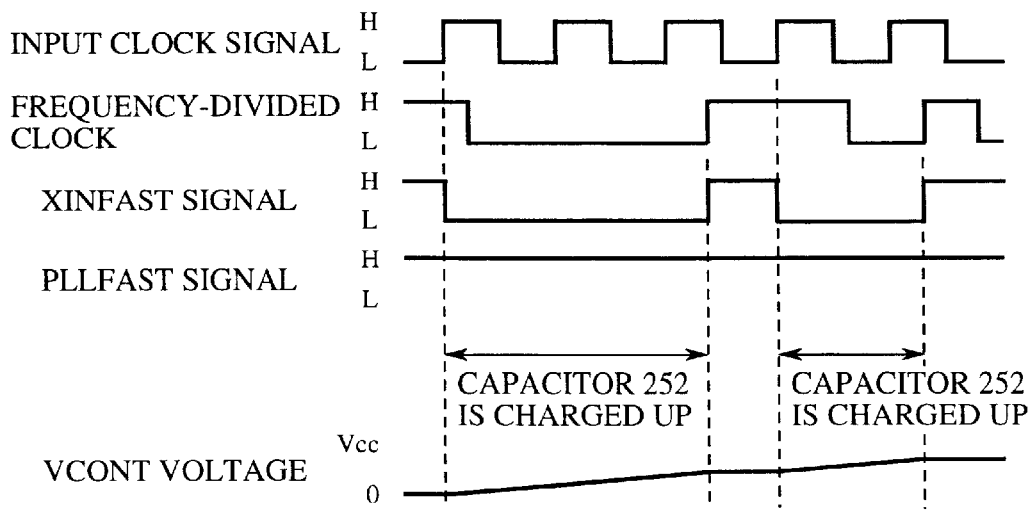
FIG. 3 is a timing chart showing the operation of the PLL frequency multiplier as shown in FIG. 2 when the phase of an input clock signal leads that of a frequency-divided clock signal.

In operation, when the input clock signal applied to the input terminal Xin is furnished to the PLL frequency multiplier 2 via the switch 7, the VCO 23 starts oscillating at a certain frequency. The frequency divider 24 divides the frequency of the frequency-multiplied clock signal output from the VCO 23 and then furnishes the frequency-divided clock signal to the phase comparator 21. The phase comparator 21 then compares the frequency of the input clock signal applied thereto via the input terminal Xin with that of the frequency-divided clock signal by determining the difference between the phases of the rising edges of those signals. When the rising edges of the input clock signal applied thereto via the input terminal Xin lead those of the frequency-divided clock signal, i.e., when the phase of the input clock signal leads that of the frequency-divided clock signal, the phase comparator 21 determines that the frequency of the frequency-divided clock signal is lower than that of the input clock signal and then causes the XINFAST signal to make a "High" to "Low" transition upon the next rising edge of the input clock signal applied thereto via the input terminal Xin, as shown in FIG. 3. After that, the phase comparator 21 causes the XINFAST signal to make a "Low" to "High" transition upon the next rising edge of the frequency-divided clock signal so as to generate a "Low" level pulse of the XINFAST signal having a duration corresponding to the difference between the phases of the input clock signal and the frequency-divided clock signal. In the meantime, the PLLFAST signal is held at a "High" level. When the charge pump 22 receives the "Low" level pulse of the XINFAST signal, it generates a pulse held at a "High" level only during the interval that the input pulse is at a "Low" level. The "High" level pulse from the charge pump 22 charges the capacitor 252 and the VCONT voltage therefore increases by the charge on the capacitor 252. As a result, the frequency of the frequency-multiplied clock from the VCO 23 increases with the amount of increase in the VCONT voltage.

Figure 4:
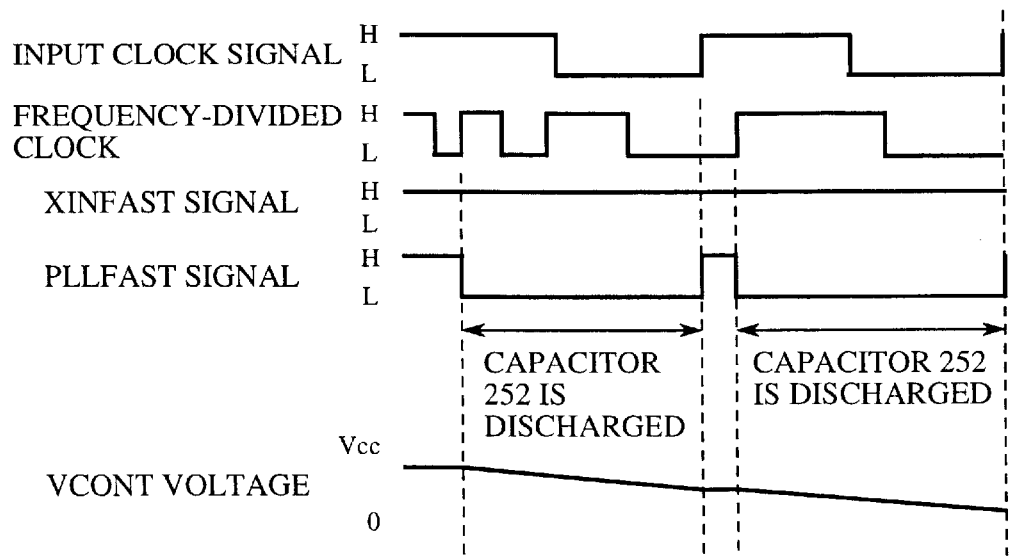
FIG. 4 is a timing chart showing the operation of the PLL frequency multiplier as shown in FIG. 2 when the phase of the input clock signal lags behind that of the frequency-divided clock signal.

In contrast, when the rising edges of the frequency-divided clock signal lead those of the input clock signal applied thereto via the input terminal Xin, i.e., when the phase of the input clock signal lags behind that of the frequency-divided clock signal, the phase comparator 21 determines that the frequency of the frequency-divided clock signal is higher than that of the input clock signal and then causes the PLLFAST signal to make a "High" to "Low" transition upon the next rising edge of the frequency-divided clock signal from the frequency divider 24, as shown in FIG. 4. After that, the phase comparator 21 causes the PLLFAST signal to make a "Low" to "High" transition upon the next rising edge of the input clock signal so as to generate a "Low" level pulse of the PLLFAST signal having a duration corresponding to the difference between the phases of the frequency-divided clock signal and the input clock signal applied thereto via the input terminal Xin. In the meantime, the XINFAST signal is held at a "High" level. When the charge pump 22 receives the "Low" level pulse of the PLLFAST signal, it generates a pulse held at a "Low" level only during the interval that the input pulse is at a "Low" level. The "Low" level pulse from the charge pump 22 discharges the capacitor 252 and the VCONT voltage therefore increases by the amount of discharge from the capacitor 252. As a result, the frequency of the frequency-multiplied clock from the VCO 23 decreases with the amount of decrease in the VCONT voltage.

Figure 5:
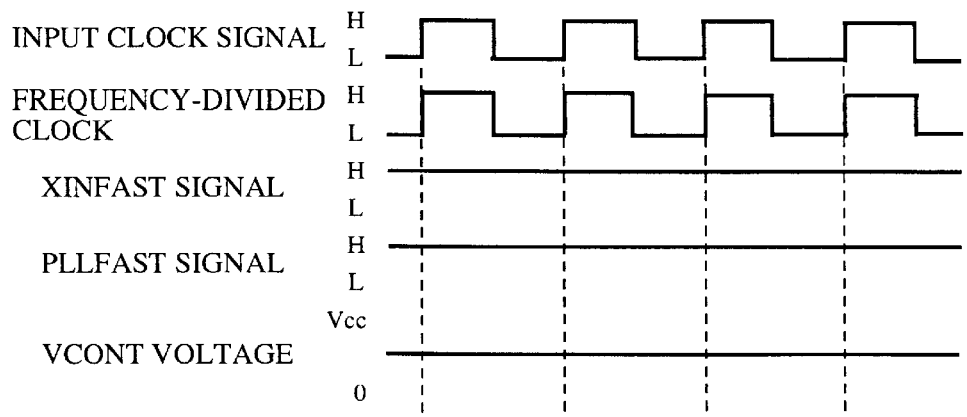
FIG. 5 is a timing chart showing the operation of the PLL frequency multiplier as shown in FIG. 2 when the input clock signal is in phase with the frequency-divided clock signal.

The PLL frequency multiplier 2 repeats the two control operations mentioned above until the rising edges of the input clock signal applied via the input terminal Xin to the PLL frequency multiplier 2 are in phase with those of the frequency-divided clock signal, as shown in FIG. 5, and the frequency of the input clock signal is therefore equal to that of the frequency-divided clock signal. In this way, the PLL frequency multiplier 2 adjusts the frequency and phase of its output or PLL output using the XINFAST and PLLFAST signals.

The counter 41 reloads the maximum count value thereinto and resets its output so as to put its output at a "Low" level every time the control signal applied to the control terminal thereof becomes a "High" level. The counter 41 then starts counting down pulses of the clock signal applied to the PLL frequency multiplier 2 from the maximum count value. Each of the two switches 7 and 43 is brought into conduction or placed to the ON position when a switching signal applied to the control terminal thereof becomes a "High" level. In contrast, each of the two switches 7 and 43 is brought out of conduction or placed to the OFF position when the switching signal applied to the control terminal thereof becomes a "Low" level. A signal passing through each of the two switches 7 and 43 has either a "High" level or a "Low" level according to whether a corresponding input signal has a voltage greater than or equal to or less than a threshold value.

While the clock supply circuitry is placed in the clock supply stopping state or stop state in which it is stopping the supply of the system clock signal to the integrated circuit 5, both the PLL frequency multiplier 2 and the oscillator driving circuit 3 are at a standstill. When bringing the clock supply circuitry to the stop state, the stop instruction signal is made to become a "High" level and the recovery instruction signal is made to become a "Low" level. As a result, the SR flip-flop 6 is reset and its Q output becomes a "Low" level, and therefore the switch 7 is brought out of conduction or placed to the OFF position. The input terminal Xin is therefore disconnected from the input terminal of the PLL frequency multiplier 2. The stop instruction signal at a "High" level is also delivered, by way of the OR gate 45, to the control terminal of the counter 41 as the control signal at a "High" level. As a result, the counter 41 reloads the maximum count value thereinto and resets its output so as to put its output at a "Low" level, and starts counting down pulses of the input clock signal applied to the PLL frequency multiplier 2. In this case, since no clock pulse is applied to the counter 41, the counter 41 keeps its count value at the maximum count value. Furthermore, the SR flip-flop 42 is reset and its Q output becomes a "Low" level, and therefore the switch 43 is brought out of condition or placed to the OFF position. As a result, the output terminal of the PLL frequency multiplier 2 is disconnected from the integrated circuit 5.

Next, a description will be made as to a recovery process of returning the clock supply circuitry from the clock supply stopping state or stop state in which the PLL frequency multiplier 2 is stopping the supply of the system clock signal to its original state or clock supply state in which the PLL frequency multiplier 2 is supplying the system clock signal to the integrated circuit 5, i.e., canceling the stopping of the supply of the system clock signal to the integrated circuit 5. When the recovery instruction signal becomes a "High" level while the clock supply circuitry is placed in the clock supply stopping state, the semiconductor device 1 starts the recovery process. Simultaneously, the stop instruction signal becomes a "Low" level. After the recovery process is started, the PLL frequency multiplier 2 and the oscillator driving circuit 3 start working first. The SR flip-flop 6 is then set and its Q output or switching signal becomes a "High" level, and therefore the switch 7 is brought into condition or placed to the ON position.

Immediately after the PLL frequency multiplier 2 starts working, the output of the PLL frequency multiplier 2 is unstable. The PLL frequency multiplier 2 therefore makes either one of the XINFAST and PLLFAST signals become a "Low" level frequently in order to adjust the frequency and phase of the PLL output, i.e., frequency-multiplied clock signal, as shown in FIGS. 3 and 4. The NAND gate 44 furnishes a signal at a "High" level frequently, and hence the OR gate 45 furnishes a signal at a "High" level frequently. As a result, the counter 41 reloads the maximum count value thereinto and resets its output to a "Low" level frequently. In other words, although the counter 41 starts counting down pulses of the input clock signal from the maximum count value every time the counter 41 reloads the maximum count value thereinto, either one of the XINFAST and PLLFAST signals becomes a "Low" level and therefore the counter 41 is reset again before the counter 41 overflows while the PLL frequency multiplier 2 is unstable. Thus the SR flip-flop 42 is not set and the switch 43 is therefore held in the OFF position while the PLL frequency multiplier 2 is unstable. As a result, no system clock signal is supplied to the integrated circuit 5 while the PLL frequency multiplier 2 is unstable.

Figure 6:
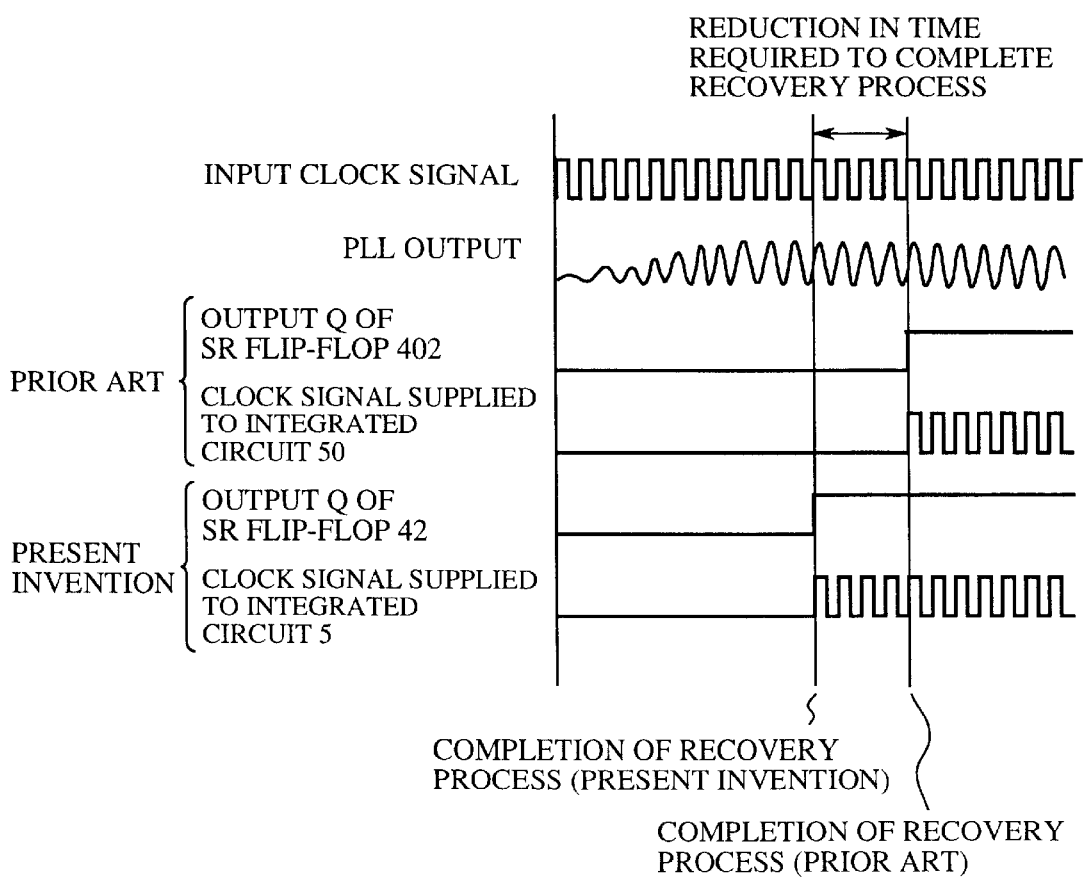
FIG. 6 is a timing chart showing a recovery process of canceling the stopping of the supply of a clock signal which is performed by the clock supply circuitry according to the embodiment of the present invention when a clock generating device is connected to the clock supply circuitry.
Figure 7:
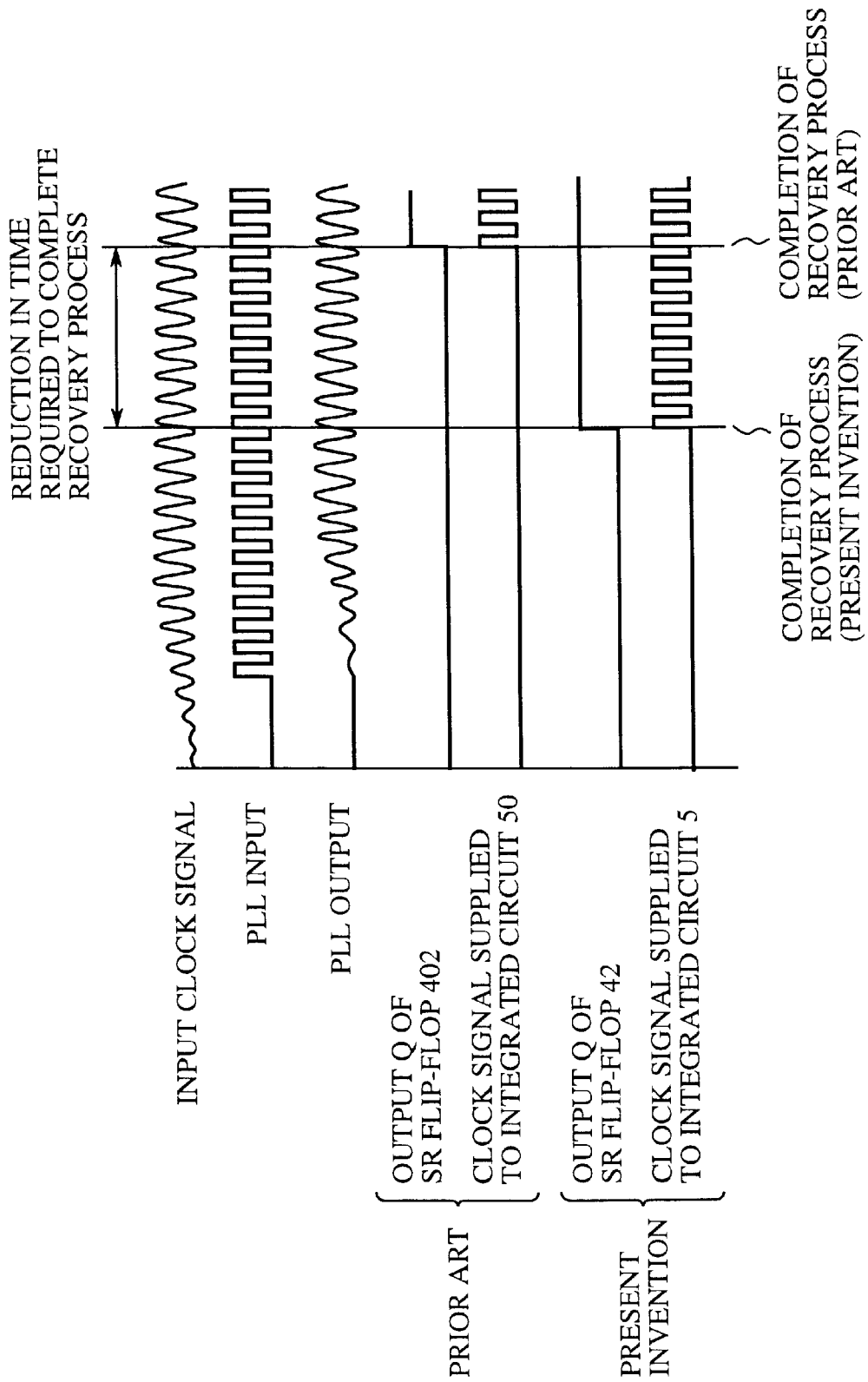
FIG. 7 is a timing chart showing a recovery process of canceling the stopping of the supply of a clock signal which is performed by the clock supply circuitry according to the embodiment of the present invention when an external oscillator is connected to the clock supply circuitry.
Figure 10:
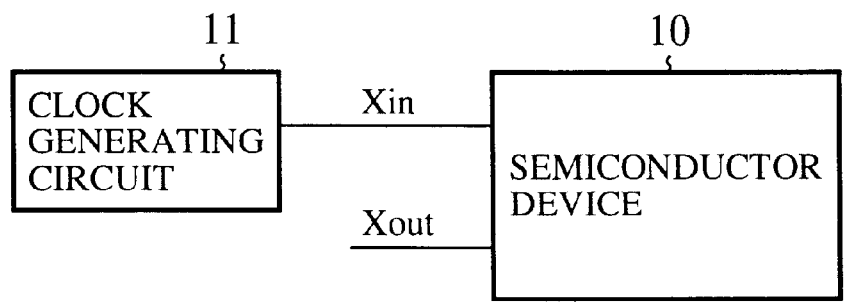
FIG. 10 is a block diagram showing a semiconductor device including clock supply circuitry, a clock generating circuit being connected to the semiconductor device.
Figure 11:
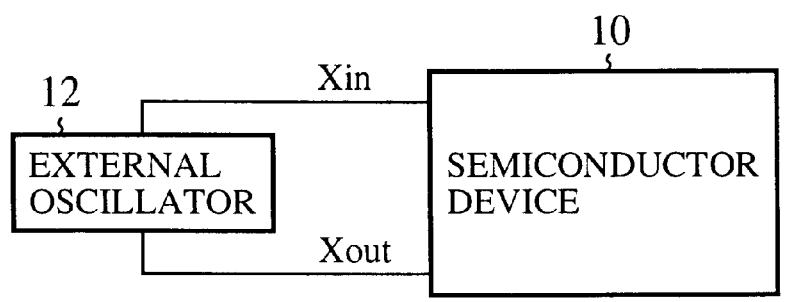
FIG. 11 is a block diagram showing a semiconductor device including clock supply circuitry, an external oscillator being connected to the semiconductor device.
Figure 12:
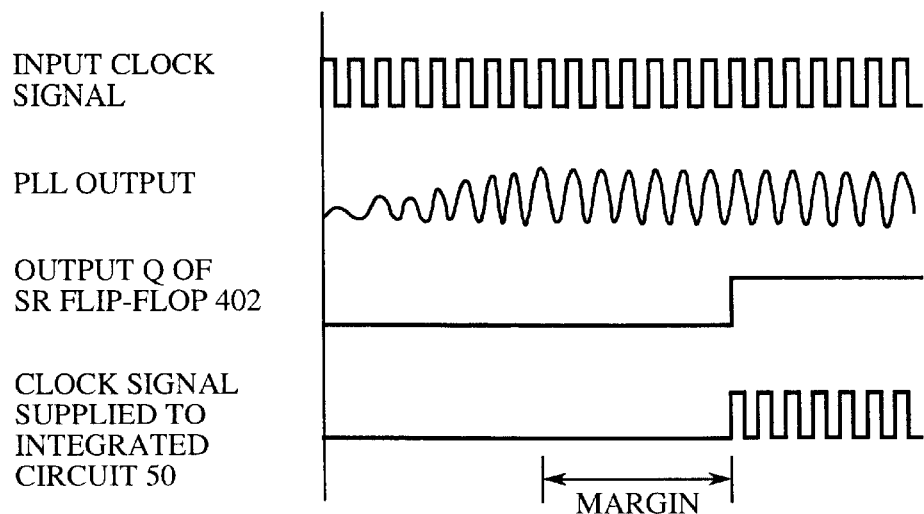
FIG. 12 is a timing chart showing a recovery process of canceling the stopping of the supply of a clock signal which is performed by the prior art clock supply circuitry of FIG. 9 when a clock generating device is connected to the prior art clock supply circuitry.
Figure 13:
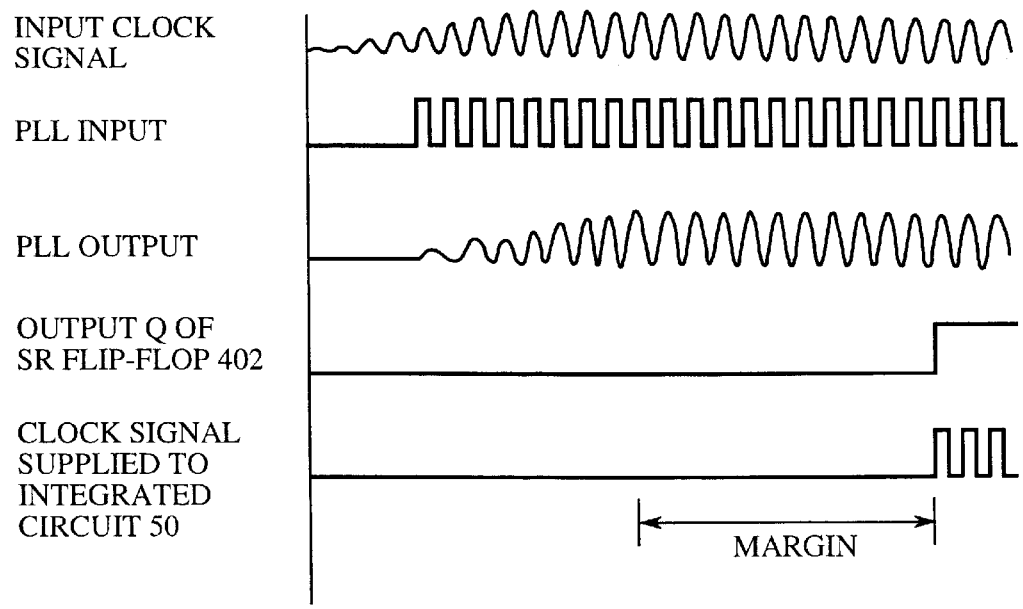
FIG. 13 is a timing chart showing a recovery process of canceling the stopping of the supply of a clock signal which is performed by the prior art clock supply circuitry of FIG. 9 when an external oscillator is connected to the prior art clock supply circuitry.

After that, when the counter 41 underflows and then furnishes a signal at a "High" level to the S terminal of the SR flip-flop 42 while the PLL frequency multiplier 2 keeps both the XINFAST and PLLFAST signals at a "High" level, the SR flip-flop 42 is set and its Q output becomes a "High" level. As a result, the switch 43 is brought into conduction or placed to the ON position. The frequency-multiplied clock signal output from the PLL frequency multiplier 2 is thus supplied to the integrated circuit 5 as the system clock signal, and the recovery process is completed. Referring next to FIGS. 6 and 7, there are illustrated timing charts showing the waveforms of the input clock signal, the PLL output or frequency-multiplied clock signal, the output of the SR flip-flop 42, and the system clock signal supplied to the integrated circuit 5 that vary during the conduction of the recovery process. FIG. 6 shows a case where a clock generating device 11 is connected to the semiconductor device 1, as shown in FIG. 10. FIG. 7 shows a case where an external oscillator 12 is connected to the semiconductor device 1, as shown in FIG. 11. As shown in FIGS. 6 and 7, the PLL output stability detecting circuit 4 supplies the frequency-multiplied clock signal output from the PLL frequency multiplier 2 to the integrated circuit 5 immediately after it determines that the output of the PLL frequency multiplier 2 becomes stable. Therefore, the clock supply circuitry according to the present invention makes it possible to reduce the length of time that elapses until the supply of the frequency-multiplied clock signal to the integrated circuit 5 is started after the recovery instruction signal is asserted by an extent corresponding to the margin which the maximum count value set in the prior art allows for.

Figure 8:
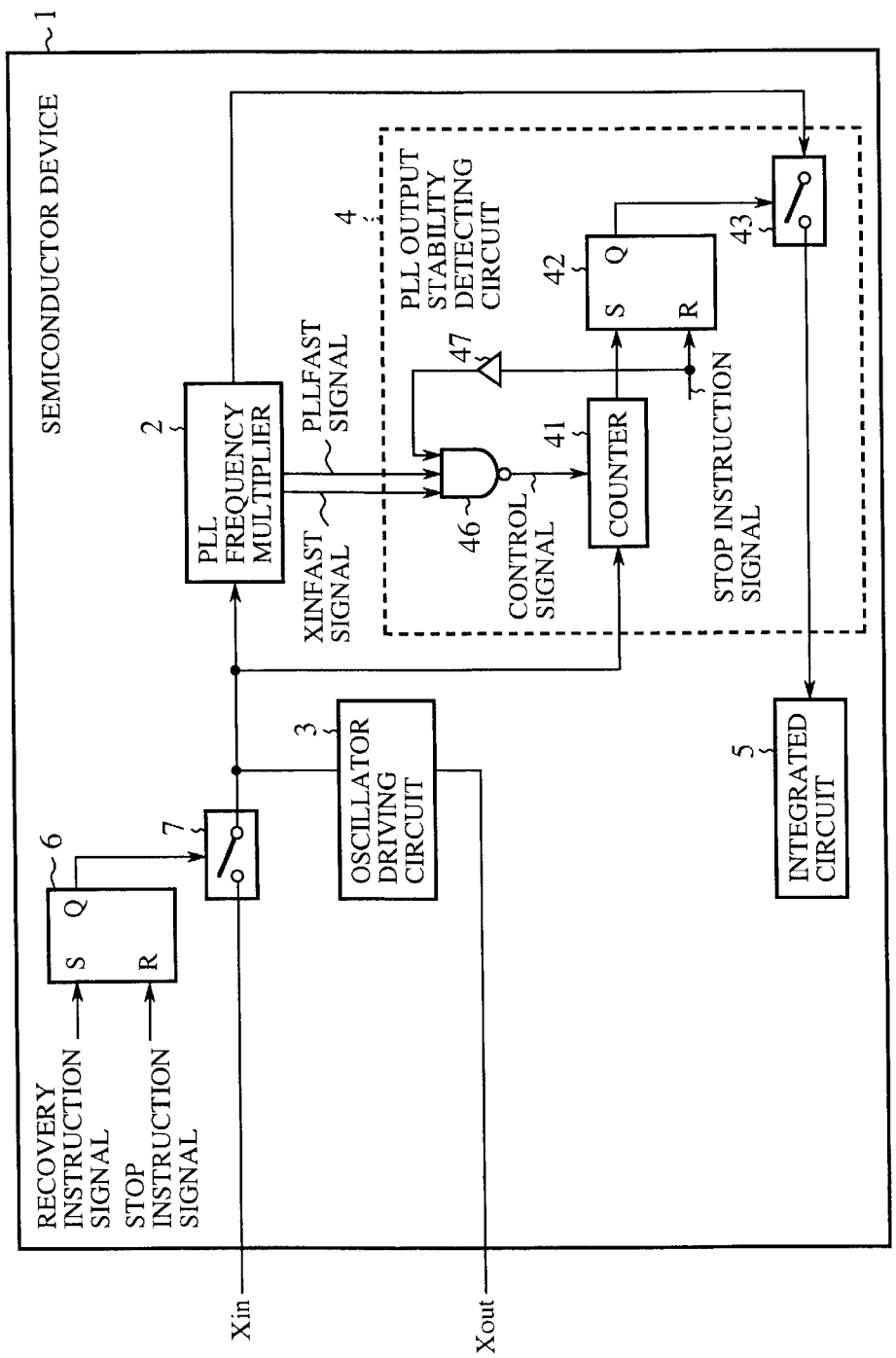
FIG. 8 is a schematic circuit diagram showing the structure of clock supply circuitry according to a variant of the embodiment of the present invention.
Figure 9:
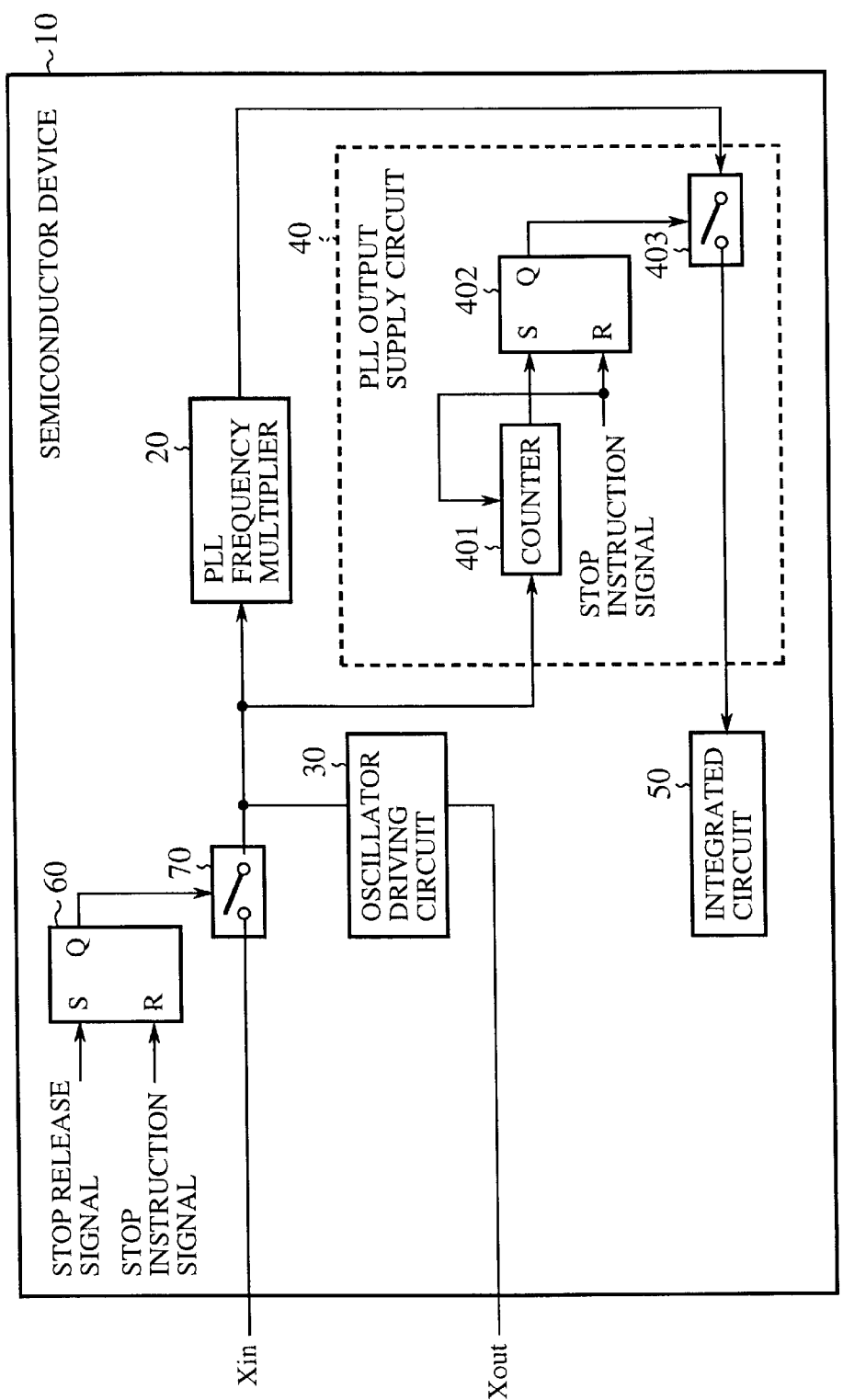
FIG. 9 is a schematic circuit diagram showing the structure of prior art clock supply circuitry.

The PLL output stability detecting circuit 4 is not limited to the specific embodied one as shown in FIG. 1. The PLL output stability detecting circuit 4 can have an alternative structure as shown in FIG. 8. In the figure, reference numeral 46 denotes a three-input NAND gate for implementing the logical NAND operation on the XINFAST and PLLFAST signals from the PLL frequency multiplier 2 and the inversion of the stop instruction signal from an inverter 47, and for furnishing the logical NAND operation result to the counter 41.

In the variant of FIG. 8, when the stop instruction signal becomes a "High" level, it is delivered, by way of the inverter 47, to the three-input NAND gate 46 as a signal at a "Low" level. As a result, the three-input NAND gate 46 furnishes a signal at a "High" level to the control terminal of the counter 41 and the counter 41 reloads the maximum count value thereinto and resets its output so as to put its output at a "Low" level, and starts counting down pulses of the input clock signal applied to the PLL frequency multiplier 2. In this case, since no clock pulse is applied to the counter 41, the counter 41 keeps its count value at the maximum count value. When the recovery instruction signal becomes a "High" level while the clock supply circuitry is placed in the clock supply stopping state, the semiconductor device 1 starts the recovery process. Simultaneously, the stop instruction signal becomes a "Low" level and is delivered, by way of the inverter 47, to the three-input NAND gate 46 as a signal at a "High" level. As previously mentioned, immediately after the PLL frequency multiplier 2 starts working, the output of the PLL frequency multiplier 2 is unstable. The PLL frequency multiplier 2 therefore makes either one of the XINFAST and PLLFAST signals become a "Low" level frequently in order to adjust the frequency and phase of the PLL output, i.e., frequency-multiplied clock signal. The NAND gate 46 thus furnishes a signal at a "High" level frequently, and hence the counter 41 reloads the maximum count value thereinto and resets its output to a "Low" level frequently. Although the counter 41 starts counting down pulses of the input clock signal from the maximum count value every time the counter 41 reloads the maximum count value thereinto, either one of the XINFAST and PLLFAST signals becomes a "Low" level and the counter 41 is therefore reset again before the counter 41 underflows while the PLL frequency multiplier 2 is unstable.

As previously mentioned, in accordance with the present invention, the clock supply circuitry can supply the frequency-multiplied clock signal output from the PLL frequency multiplier 2 to the integrated circuit 5 immediately after the PLL output stability circuit determines that the output of the PLL frequency multiplier 2 becomes stable. Therefore, the clock supply circuitry according to the present invention makes it possible to reduce the length of time that elapses until the supply of the frequency-multiplied clock signal to the integrated circuit 5 is started after the recovery process is started, as compared with the prior art. Accordingly, the present invention can overcome the drawback of needing much time to complete the recovery process and hence causing a delay in starting the integrated circuit 5. Since the clock supply circuitry does not supply the frequency-multiplied clock signal output from the PLL frequency multiplier 2 to the integrated circuit 5 before the PLL output stability circuit determines that the output of the PLL frequency multiplier 2 becomes stable, the clock supply circuitry can prevent the integrated circuit 5 from running away.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of supplying a system clock signal to an internal circuit, comprising the steps of:

when returning to a clock supply state in which a phase-locked loop or PLL frequency multiplier is generating a frequency-multiplied clock signal from an input clock signal and supplying the frequency-multiplied clock signal to said internal circuit, the frequency-multiplied clock signal having a frequency that is an integral multiple of the frequency of the input clock signal, from a clock supply stopping state in which said PLL frequency multiplier is stopping the generation of the frequency-multiplied clock signal, determining whether the frequency-multiplied clock signal from said PLL frequency multiplier becomes stable based upon at least a NAND circuit outputting to a counter; and supplying the frequency-multiplied clock signal as the system clock signal to said internal circuit after it is determined that the frequency-multiplied clock signal becomes stable.

2. The method according to claim 1, wherein said determining step is the step of determining whether signals generated by said PLL frequency multiplier for controlling the frequency of the frequency-multiplied clock signal indicate that the frequency of the frequency-multiplied clock signal becomes stable, and, when the signals indicate that the frequency of the frequency-multiplied clock signal becomes stable, the frequency-multiplied clock signal is supplied as the system clock signal to said internal circuit.

3. Clock supply circuitry for supplying a system clock signal to an internal circuit, said circuitry comprising:

a phase-locked loop or PLL frequency multiplier for generating a frequency-multiplied clock signal having a frequency that is an integral multiple of the frequency of an input clock signal; and a PLL output stability detecting circuit including at least a NAND circuit outputting to a counter, said PLL stability detecting circuit for determining whether the frequency-multiplied clock signal from said PLL frequency multiplier becomes stable when said clock supply circuitry is made to return from a clock supply stopping state in which said PLL frequency multiplier is stopping the generation of the frequency-multiplied clock signal to a clock supply state in which said PLL frequency multiplier is generating and supplying the frequency-multiplied clock signal to said internal circuit, and for supplying the frequency-multiplied clock signal from said PLL frequency multiplier as the system clock signal to said internal circuit after said PLL output stability detecting circuit determines that the frequency-multiplied clock signal becomes stable.

4. The circuitry according to claim 3, wherein said PLL output stability detecting circuit includes a switch disposed between an output terminal of said PLL frequency multiplier and said internal circuit, said switch being placed to ON position when said PLL output stability detecting circuit supplies the frequency-multiplied clock signal as the system clock signal to said internal circuit, and a control means for placing said switch to the ON position when signals generated by said PLL frequency multiplier for controlling the frequency of the frequency-multiplied clock signal indicate that the frequency of the frequency-multiplied clock signal becomes stable when returning said clock supply circuitry from the clock supply stopping state to the clock supply state.

5. The circuitry according to claim 4, wherein said PLL frequency multiplier includes: a phase comparator for comparing a phase of the input clock signal with that of a frequency-divided clock signal, and for furnishing an XINFAST signal including a pulse having a duration corresponding to a phase difference between the phases of the input clock signal and the frequency-divided clock signal and a PLLFAST signal fixed at a certain level opposite to the level of the pulse of the XINFAST signal when the phase of the input clock signal leads that of the frequency-divided clock signal, for furnishing a PLLFAST signal including a pulse having a duration corresponding to a phase difference between the phases of the input clock signal and the frequency-divided clock signal and an XINFAST signal fixed at a certain level opposite to the level of the pulse of the PLLFAST signal when the phase of the input clock signal lags behind that of the frequency-divided clock signal, and for furnishing XINFAST and PLLFAST signals fixed at the certain level when the input clock signal is in phase with the frequency-divided clock signal; a charge pump for furnishing a pulse at a "High" level having a duration corresponding to the pulse of the XINFAST signal when the phase of the input clock signal leads that of the frequency-divided clock signal, and for furnishing a pulse at a "Low" level having a duration corresponding to the pulse of the PLLFAST signal when the phase of the input clock signal lags behind that of the frequency-divided clock signal; a low-pass filter for converting the pulse from said charge pump into a DC voltage; a voltage-controlled oscillator for generating and furnishing the frequency-multiplied clock signal-having a frequency corresponding to the DC voltage; and a frequency divider for dividing the frequency of the frequency-multiplied clock signal so as to generate the frequency-divided clock signal having a frequency that is an integral submultiple of that of the frequency-multiplied clock signal.

6. The circuitry according to claim 5, wherein said control means includes: the NAND circuit for receiving the XINFAST and PLLFAST signals from said PLL frequency multiplier and for generating a control signal asserted when the XINFAST and PLLFAST signals are at different or opposite levels; the counter, responsive to the control signal from said NAND circuit, for reloading a maximum count value thereinto, resetting its output to a "Low" level, and starting counting down the input clock signal from the maximum count value, and for furnishing a signal at a "High" level when it underflows; and an SR flip-flop having an S terminal for receiving an output of said counter, an R terminal for receiving a stop instruction signal that becomes a "High" level when said clock supply circuitry stops the supply of the system clock signal to said internal circuit, and a Q terminal via which said SR flip-flop furnishes a switching signal for switching said switch between ON and OFF positions.

* * * * *